United States Patent
Delgado et al.

(10) Patent No.: US 9,335,637 B2
(45) Date of Patent: May 10, 2016

(54) LASER-PRODUCED PLASMA EUV SOURCE WITH REDUCED DEBRIS GENERATION UTILIZING PREDETERMINED NON-THERMAL LASER ABLATION

(75) Inventors: Gildardo Delgado, Livermore, CA (US); Daniel Wack, Fredericksburg, VA (US)

(73) Assignee: KLA-Tencor Corporation, Milpitas, CA (US)

( * ) Notice: Subject to any disclaimer, the term of this patent is extended or adjusted under 35 U.S.C. 154(b) by 102 days.

(21) Appl. No.: 13/227,586

(22) Filed: Sep. 8, 2011

(65) Prior Publication Data

US 2013/0063803 A1    Mar. 14, 2013

(51) Int. Cl.
*G03F 7/20* (2006.01)
*H05G 2/00* (2006.01)

(52) U.S. Cl.
CPC ............ *G03F 7/70033* (2013.01); *H05G 2/005* (2013.01); *H05G 2/008* (2013.01)

(58) Field of Classification Search
USPC ..................................................... 250/504 R
See application file for complete search history.

(56) References Cited

U.S. PATENT DOCUMENTS

| | | | |
|---|---|---|---|
| 4,987,006 A * | 1/1991 | Williams et al. | 427/597 |
| 5,173,441 A * | 12/1992 | Yu et al. | 438/676 |
| 5,395,356 A * | 3/1995 | King et al. | 606/4 |
| 6,275,565 B1 * | 8/2001 | Tomie | 378/119 |
| 7,317,196 B2 | 1/2008 | Partlo et al. | |
| 7,598,509 B2 | 10/2009 | Ershov et al. | |
| 2005/0211910 A1 * | 9/2005 | Bloom et al. | 250/423 P |
| 2006/0215712 A1 * | 9/2006 | Ziener et al. | 372/2 |
| 2007/0158577 A1 | 7/2007 | Tomie | |
| 2008/0047940 A1 * | 2/2008 | Li et al. | 219/121.68 |
| 2009/0184417 A1 * | 7/2009 | Webster et al. | 257/729 |
| 2010/0078577 A1 | 4/2010 | Moriya et al. | |
| 2010/0090133 A1 | 4/2010 | Endo et al. | |
| 2010/0213395 A1 | 8/2010 | Ueno et al. | |
| 2011/0079736 A1 | 4/2011 | Hansson et al. | |

FOREIGN PATENT DOCUMENTS

| | | |
|---|---|---|
| EP | 2538759 A1 | 12/2012 |
| RU | 2301485 C2 | 6/2007 |
| WO | 2011102277 A1 | 8/2011 |

OTHER PUBLICATIONS

Heading: Laser Ablation Sub Heading: Fundamentals & applications Author: Samuel S. Mao Date: Mar. 10, 2005.*
Pulsed laser ablation of solids: Transition from normal vaporization to phase explosion Article in Applied Physics A • Jul. 2001 Alexander V. Bulgakov Appl. Phys. A 73, 199-208 (2001) / Digital Object Identifier (DOI) 10.1007/s003390000686.*
Femtosecond Material Science—Inducing and Probing Nonthermal Transitions in Semiconductors S. K. Sundaram1 and Eric Mazur.*

(Continued)

*Primary Examiner* — Phillip A Johnston
*Assistant Examiner* — Sean Luck
(74) *Attorney, Agent, or Firm* — Suiter Swantz pc llo

(57) ABSTRACT

A method and apparatus for generating extreme ultraviolet (EUV) light is disclosed. The method may comprise non-thermally ablating a target material utilizing a first laser beam. The first laser beam may be configured for ejecting a portion of the target material in a non-thermal manner to create a plume. The method may further comprise irradiating the plume utilizing a second laser beam to produce a high-temperature plasma for EUV radiation.

18 Claims, 2 Drawing Sheets

(56) References Cited

OTHER PUBLICATIONS

Pacific Northwest National Laboratory, Richland, WA 99352; Visiting Scientist, Plasma Science Fusion Center, Massachusetts Institute of Technology, Cambridge, MA 02139 Division of Engineering and Applied Sciences.*

A. Brodeur et al., Ultrafast white-light continuum generation and self-focusing in transparent condensed media, Journal of the Optical Society of America B, Jan. 1999, p. 637-650, vol. 16, No. 4, Optical Society of America.

C. Grey Morgan, Laser-induced breakdown of gases, Reports on Progress in Physics, 1975, p. 621-665, vol. 38, No. 5.

Chen et al., The Soft-Sphere Equation of State for Liquid Flibe, Fusion Science and Technology, May 1992, pp. 1525-1530, vol. 21, No. 3P2A, American Nuclear Society.

Daguzan et al., Direct Observation of Multiple Photon Absorption by Free Electrons in a Wide Band-Gap Insulator under Strong Laser Irradiation, Physical Review Letters, Oct. 24, 1994, pp. 2352-2355, vol. 73, No. 17, American Physical Society.

Eva et al., Nonlinear absorption phenomena in optical materials for the UV-spectral range, Proc. SPIE, Nov. 20, 1996, pp. 476-482, vol. 2870, SPIE.

Eva et al., Pulse-length dependence of absorptance and degradation rate of fused silica at 248 nm, Proc. SPIE, May 13, 1997, pp. 72-79, vol. 2966, SPIE.

M.D. Feit et al., Ultra-short pulse laser interaction with transparent dielectrics, Applied Physics A Materials Science & Processing, Jun. 23, 2004, p. 1657-1661, vol. 79, Issue 7, Springer-Verlag.

Kaiser et al., Microscopic processes in dielectrics under irradiation by subpicosecond laser pulses, Physical Review B, May 1, 2000, p. 11 437-11 450, vol. 61, No. 17, The American Physical Society.

Kennedy et al., A First-Order Model for Computation of Laser-Induced Breakdown Thresholds in Ocular and Aqueous Media: Part II—Comparison to Experiment, IEEE Journal of Quantum Electronics, Dec. 1995, p. 2250-2257, vol. 31, No. 12, IEEE.

D.J. Krajnovich et al., Sudden onset of strong absorption followed by forced recovery in KrF laser-irradiated fused silica, Optics Letters, Mar. 15, 1993, p. 453-455, vol. 18, No. 6, The Optical Society, OSA Publishing.

J.C. Miller et al., Laser Ablation and Desorption, Academic Press, Dec. 10, 1997, pp. 152-153, 186-191, 225-226, 228, and 232, vol. 30 of Experimental Methods in the Physical Sciences.

Q. Feng et al., Theory and Simulation on the Threshold of Water Breakdown Induced by Focused Ultrashort Laser Pulses, IEEE Journal of Quantum Electronics, Feb. 1997, pp. 127-137, vol. 33, No. 2, IEEE.

Joachim Noack et al., Laser-Induced Plasma Formation in Water at Nanosecond to Femtosecond Time Scales: Calculation of Thresholds, Absorption Coefficients, and Energy Density, IEEE Journal of Quantum Electronics, Aug. 1999, pp. 1156-1167, vol. 35, No. 8, IEEE.

B.C. Stuart et al., Nanosecond-to-femtosecond laser-induced breakdown in dielectrics, Physical Review B, Jan. 15, 1996, pp. 1749-1761, vol. 53, No. 4, The American Physical Society.

St. Thomas et al., KrF Laser induced absorption in synthetic fused silica, Proceedings of SPIE, May 1997, pp. 56-64, vol. 2966, The International Society for Optical Engineering.

S. Thomas et al., Effect of excimer laser radiation on the optical properties of synthetic fused silica, Glass Science and Technology, 1994, pp. 19-24, vol. 67, Verlag der Deutschen Glastechnischen Gesellschaft, Frankfurt Am Main.

* cited by examiner

LASER-PRODUCED PLASMA EUV SOURCE WITH REDUCED DEBRIS GENERATION UTILIZING PREDETERMINED NON-THERMAL LASER ABLATION

TECHNICAL FIELD

The disclosure generally relates to extreme ultraviolet, and more particularly to a method and apparatus for generating extreme ultraviolet light via laser produced plasma.

BACKGROUND

Extreme ultraviolet (EUV) light is high-energy ultraviolet radiation generally defined to be electromagnetic radiation having wavelengths ranging between about 10 nm to about 120 nm. EUV may be artificially generated by laser produced plasma.

In a conventional laser produced plasma (LPP) EUV generator, a EUV light generating substance may be released as droplets in to a chamber. A laser beam may then irradiate the droplets inside the chamber. When the laser beam irradiates a droplet, the droplet is excited to a plasma state and generates EUV light. However, a portion of the droplet may fragment and scatter during this process, forming debris. Such debris may not transform to plasma, and may remain inside the chamber.

Therein lies a need for a method and apparatus for generating EUV light via laser produced plasma with reduced debris.

SUMMARY

The present disclosure is directed to a method for generating extreme ultraviolet (EUV) light. The method may comprise non-thermally ablating a target material utilizing a first laser beam. The first laser beam may be configured for ejecting a portion of the target material in a non-thermal manner to create a plume. The method may further comprise irradiating the plume utilizing a second laser beam to produce a high-temperature plasma for EUV radiation.

A further embodiment of the present disclosure is directed to an apparatus for generating EUV light. The apparatus may comprise an enclosure, a first laser device and a second laser device. The enclosure may be configured for enclosing a target material. The first laser device may be configured for providing a first laser beam through a first window to non-thermally ablate the target material positioned inside the enclosure to create a plume. The second laser device may be configured for providing a second laser beam through a second window to irradiate the plume inside the enclosure, wherein the irradiated plume produces a high-temperature plasma for EUV radiation. In one embodiment, the first laser beam may have pulse duration shorter than a time of dissipation of absorbed laser energy by thermal conduction of the target material, thereby ejecting a portion of the target material in a non-thermal manner to create the plume.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

The present disclosure is directed to a method and apparatus for generating EUV light via laser produced plasma from solid or liquid quasi-planar targets. The method and apparatus in accordance with the present disclosure minimizes debris usually associated with unused target material. In one embodiment, the target material is non-thermally ablated by very short pulsed laser beam(s), creating a plume above the surface of the target material. The plume created in this non-thermal manner may be subsequently irradiated with high intensity pulsed laser beams, producing a high-temperature plasma (e.g., 20-40 eV) for EUV radiation.

Figure 1:
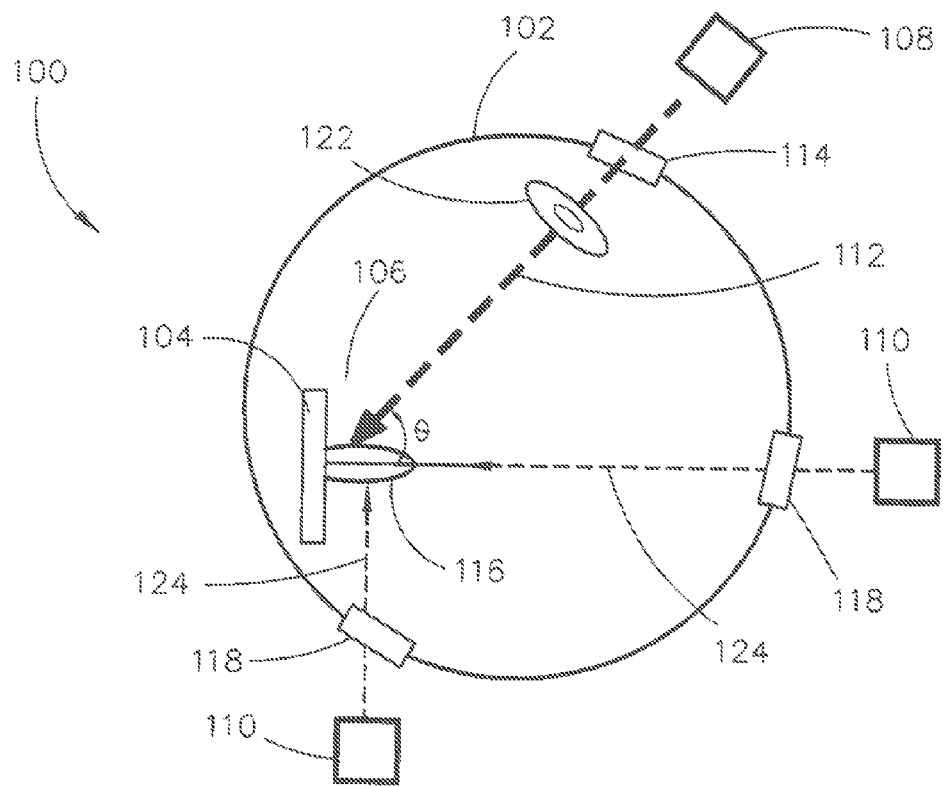
FIG. 1 is an illustration depicting an apparatus for generating EUV light.
Figure 2:
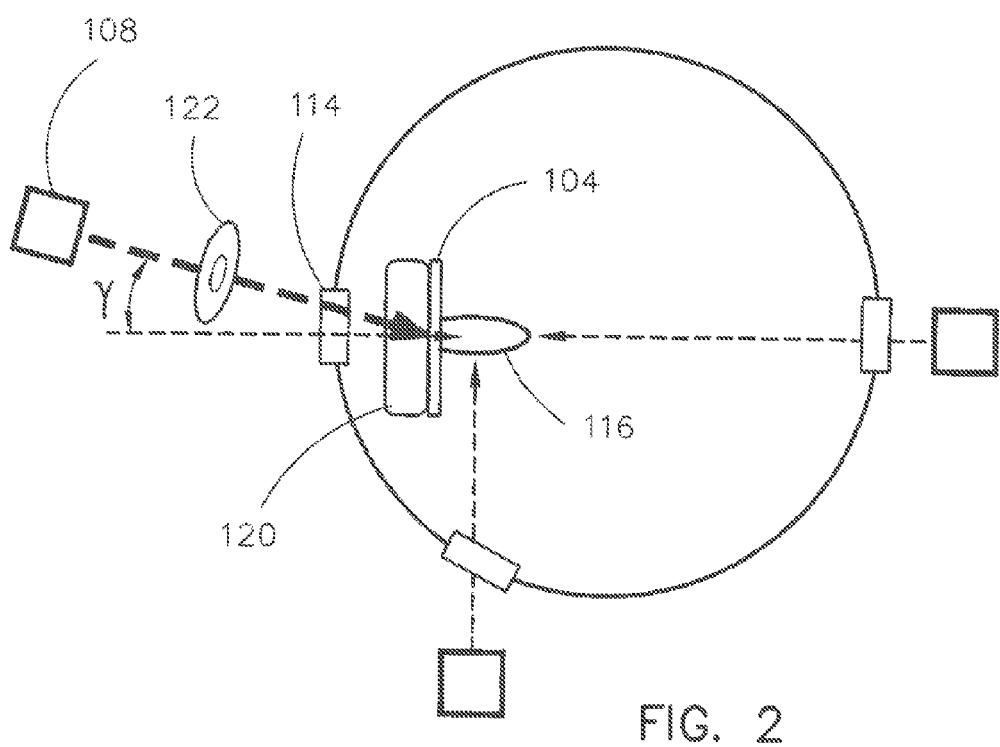
FIG. 2 is an illustration depicting another apparatus for generating EUV light.

Referring generally to FIGS. 1 and 2. FIG. 1 is an illustration depicting an apparatus 100 for generating EUV light. The apparatus 100 includes an enclosure 102, which is configured for enclosing a target material 104. The target material 104 may be any solid or liquid EUV light generating substance having a quasi-planar surface 106. Such substances may include, for example, Tin (Sn), Xeon (Xe) or the like. The enclosure 102 may also include one or more windows, allowing laser beams to enter the enclosure 102. Such windows may be made of calcium fluoride ($CaF_2$), high quality silicon dioxide ($SiO_2$) or the like.

The apparatus 100 further includes a first laser device 108 and a second laser device 110. The first laser device 108 is configured for providing a very short pulsed (e.g., in the order of picoseconds or femtoseconds) ablation laser beam 112 through a first window 114 to non-thermally ablate the target material positioned inside the enclosure 102. Such laser ablation may lead to a material removal rate (ablation rate) exceeding one-tenth monolayer per pulse (depending on laser and material properties), causing the ejection of atoms, ions, molecules, and clusters from the surface of the target material 104 as a result from the conversion of an initial electronic (or vibrational) photoexcitation into kinetic energy. That is, the short pulsed ablation laser beam 112 may eject a portion of the target material 104 in a non-thermal manner to create a plume 116 above the surface of the target material 104.

The plume 116 may then be irradiated by the laser beam from the second laser device 110. In one embodiment, the second laser device 110 is configured for providing a high intensity pulsed infrared (IR) or $CO_2$ laser beam 124 through a second window 118 to irradiate the plume 116 inside the enclosure 102. The irradiated plume then produces a high-temperature plasma (e.g., 20-40 eV) for EUV radiation.

The apparatus 100 in accordance with the present disclosure may be utilized to generate 13.5 nm EUV, in which case the enclosure 102 may be configured as a vacuum chamber. The apparatus 100 may also be utilized to generate EUV radiations having various other wavelengths, in which case the enclosure 102 is not required to be a vacuum chamber. For instance, a high pressure chamber may be utilized to generate EUV having wavelengths of above 120 nm.

The non-thermal ablation process in accordance with the present disclosure is advantageous over conventional systems. For example, utilizing very short pulsed ablation laser beam(s) may provide direct conversion of the target material to vapor, allowing the ablation process to take place without (or with very little) heat dissipation. In addition, the non-thermal ablation process only generates gas phase species, and the number of the pulses may be optimized for efficient EUV light generation, therefore avoiding excess generation of gas and subsequent transport and deposition elsewhere in the system. In this manner, a mass-limited target may be achieved without the difficulties encountered when droplet geometry is used for the target material, such as droplet gun reliability, position and timing control as well as other challenges associated with conventional systems.

In one embodiment, the target material 104 may be illuminated by the ablation laser beam 112 from the front side (the side that surface 106 faces) at normal incidence or at given angle θ from normal, as illustrated in FIG. 1. Alternatively, as illustrated in FIG. 2, the target material 104 may be illuminated by the ablation laser beam 112 from the back side through a transparent substrate 120 that focuses on the surface 106 of the target material 104. The angle of incidence may be at normal incidence or at given angle γ from normal.

It is contemplated that the plume 116 produced by the ablation process may be shaped in an effort to increase efficiency when the plume 116 is subsequently irradiated with the IR or CO2 laser beam 124. Various techniques may be utilized to shape the plume 116. For example, the surface of the target material 104 may define cavities such as grooves or the like to confine and shape expansions prior to and/or during the ablation process. In another example, an aperture or mask 122 may be positioned in the optical path between the target material 104 and the laser device 108. The aperture 122 may be used to shape the ablation area/shape, which in turn may control the shape of the plume 116 generated. In still another example, more than one laser device 108 may be utilized to ablate the target material 104, and the ablation laser beams provided by these laser devices may be angled in order to shape the plume 116.

It is also contemplated that more than one laser device 110 may be utilized to irradiate the plume 116 inside the enclosure 102. Such laser devices 110 may be positioned at various locations to provide laser beams 124 (e.g., IR or CO2 laser beams) that irradiate the plume 116 from various angles. In one embodiment, the ablation laser beams 112 and the laser beams 124 may generally set to have different wavelengths, different pulse widths and different irradiation intensities. The laser beams 124 may be focused at the plume 116 produced by the ablation process. It may be preferable that the time of irradiation with laser beams 124 be delayed to later than the time of irradiation with the ablation laser beams 112 to produce the desirable LPP at a preconfigured plane/location.

It is further contemplated that the efficiency of the non-thermal ablation process in accordance with the present disclosure may be optimized based on the properties of the ablation laser beam(s) 112 and the target material 104. Such properties may include, but are not limited to, angler of incidence, aspect ratio, target material characteristics, surface finish and the like. For instance, the energy absorbed in the target material 104 per unit surface area may depend on the laser fluence over the pulse duration $t_p$. Therefore, the ablation rate may be expressed as a function of fluence. A typical ablation threshold may be of the order of 0.1-1 $J/cm^2$, depending on the target material and the laser wavelength. The amount of ablated material (depth and volume) per pulse may be determined based on the pulse duration and the wavelength of the ablation laser beam 112, as explained in details below.

The pulse duration of the ablation laser beam is one of the parameters that may affect the ablation rate per pulse. For example, the penetration depth of the target material may be calculated based on the diffusivity of the target material and the pulse duration. A short laser pulse may restrict the energy deposition within the absorbing volume and minimize the collateral (mainly thermal) energy propagation. For instance, if the pulse width is less than the electron lattice-relaxation time of the material, then high energy densities can be created in a thin subsurface layer of the material. This results in rapid ionization and material removal with most of the deposited energy being carried by the ejected material. This means that heat diffusion and/or melting is significantly reduced. This also implies that electronic process are faster than thermal processes and that the ablation process can take place without (or with very little) heat dissipation. The outcome is direct conversion of solid to vapor with less plasma formation.

In one embodiment, the laser pulse duration $t_p$ is configured to be shorter than the time of dissipation of the absorbed laser energy by the thermal conduction $t_{th}$. Reducing the laser interaction time reduces the thermal load on the target material. This reduces melting and the heat affected volume. In general, as pulses shorten below nanosconds, the thermal penetration depth will near that of the optical absorption depth, minimizing bulk thermal damage. Furthermore, as pulses shorten, the power density or irradiance ($W/cm^2$) for each pulse may rise, improving the ablation rate and reducing thermal damages, as higher irradiance will induce a more rapid phase change. Ablation rate mechanism may take place several orders of magnitude faster than thermal conduction so that thermal effects may be avoided altogether. It is contemplated that utilizing laser systems/devices having a broad spectrum of pulse durations, ranging from nanoseconds to femtoseconds may be beneficial.

The wavelength of the ablation laser beam is another parameter that may affect the ablation rate per pulse. For example, the wavelength interaction with the target material may affect the penetration depth, which in turn may affect the ablation rate. For laser ablation with minimal thermal energy transfer to the bulk, the laser pulse with the energy delivered should exceed the binding energy of that material. In addition, target material properties and surface finishes may also need to be taken into consideration. Furthermore, nonlinear absorption by multiphoton processes may become important at high intensities. This may happen when free carriers can contribute to enhance absorption. The nonlinear absorption multiphoton processes may need to be considered and may be utilized to enhance or adjust for penetration depth and removal rate.

In one embodiment, utilizing ultraviolet (UV) laser wavelengths are highly effective since UV energies approach the dissociation energies of chemical bonds. This may result in material removal by the photochemical breakdown of covalent bonds, providing a non-thermal ablation process. Such a non-thermal ablation process may achieve very fine features with no heat affected zone. It is understood that the exact material removal rate may depend on the laser pulse penetration depth of the laser light. Various equations may be utilized to calculate the penetration depth, which may be expressed as a function of the laser wavelength as well as other parameters such as the extinction coefficient of the laser, absorption coefficient, intensity and the like.

In one exemplary implementation, Sn or Sn mixtures may be utilized as the target material 104, and short pulsed (e.g., picoseconds to femtoseconds) UV laser(s) 112 may be utilized for the ablation process. For effective EUV generation and reduced amount of unused Sn material, it may be beneficial to maximize the Sn plume for LPP EUV generation. Suppose that approximately 20 to 100 nm solid Sn material may be sufficient for generating the required EUV (e.g., for use of an inspection system), and that the penetration depths of Sn or Sn mixtures is determined to be of approximately ten's of nm's. This would suggest that one single pulse to a few pulses may be sufficient to produce the amount of material necessary for the Sn plume.

Experimental results have indicated that, for laser penetration depth of about 355 nm, 90% of the laser pulse is absorbed in the first 20 nm of the target material. For a very short pulse (e.g., femtoseconds), this may imply that one can ablate as much as 20 nm per pulse. Depending on the exact amount of material needed, one may use up to several or as may pulses necessary. If stronger absorption is require (e.g., in order to tune the amount of ablation material that is ejected), the target material (e.g., Sn) may be doped with a strong absorber. Such absorbers may include, for example, anthracene or the like. This permits max absorption of laser wavelengths such as 351 and 355 nm that induce less electronic excitation than UV lasers operating near 300 nm and below. Furthermore, longer wavelength may also be utilized if it is desirable to have more material removed per pulse.

In addition to the pulse duration and wavelength properties of the ablation laser beam(s), other factors such as the number of laser devices 108 utilized for the ablation process, the angle of incidence of each ablation laser beam or the like may be taken into consideration when calculating the ablation rate. Calculating the ablation rate may help determining the ideal number of pulses needed from the ablation laser beam(s) to produce the optimal amount of material necessary to form the plume (for EUV generation) while minimizing the potential debris that may be deposited if too much material is ejected.

Figure 3:
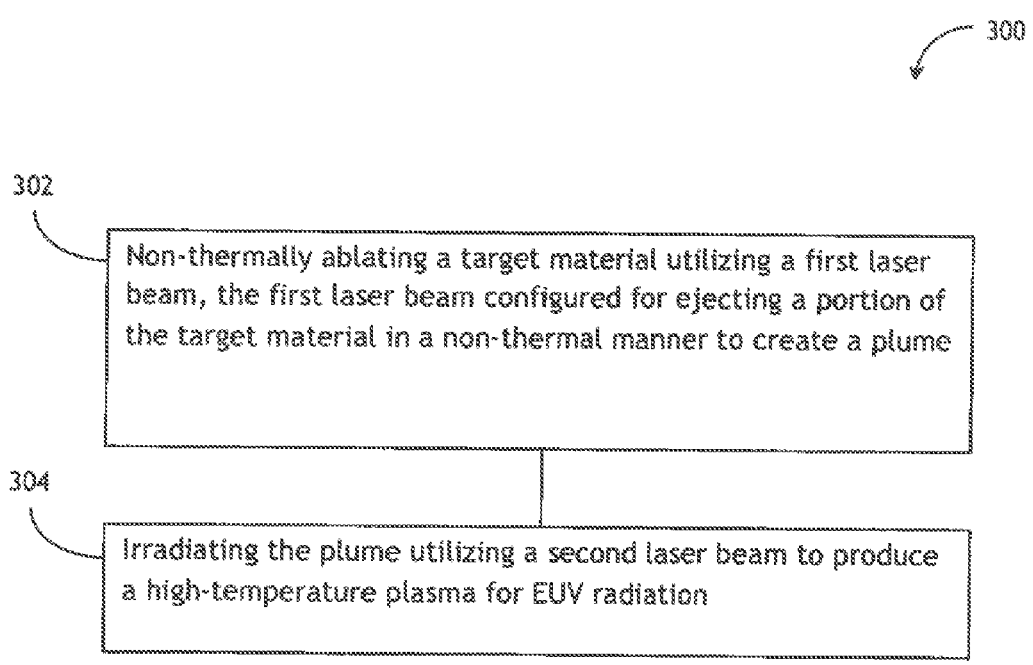
FIG. 3 is a flow diagram illustrating a method for generating EUV light.

Referring to FIG. 3, a method 300 for generating EUV light in accordance with the present disclosure is shown. Step 302 may non-thermally ablate a target material utilizing a first laser beam. The first laser beam is configured for ejecting a portion of the target material in a non-thermal manner to create a plume. In one embodiment, the first laser beam is a short pulsed laser beam having pulse durations shorter than the time of dissipation of absorbed laser energy by thermal conduction of the target material. Subsequently, step 304 may irradiate the plume utilizing a second laser beam to produce a high-temperature plasma for EUV radiation. In one embodiment, the second laser beam is a high intensity pulsed infrared or CO2 laser beam.

It is contemplated that the steps may be repeated for continuous generation of EUV light. It is understood that specific parameters (intensities, pulse durations, number of pulses or the like) for the first laser beam and/or the second laser beam may be determined based on specific requirements, including, but not limited to, desired amount of EUV light, properties of the target material, space availabilities, costs, as well as other factors.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method for generating extreme ultraviolet (EUV) light, the method comprising:
   supporting a target material on a support substrate;
   providing a first laser beam for ablating a surface of the target material to separate and eject a portion of the target material away from the surface in a non-thermal manner without heat dissipation, the first laser beam having a pulse duration multiple orders of magnitude faster than a time of heat dissipation of absorbed laser energy by thermal conduction of the target material, the first laser beam having a wavelength in a range of ultraviolet wavelengths, wherein the pulse duration, the wavelength, and an intensity of the first laser beam are tuned so that when the target material is ablated by the first laser beam, a penetration depth of the ablation is near that of an optical absorption depth of the target material to reduce thermal damage to the target material and to induce a rapid phase change of the portion of the target material ejected away from the surface of the target material when the target material is ablated by the first laser beam;
   calculating an ablation rate based on the pulse duration of the first laser beam and the wavelength of the first laser beam;
   determining a number of pulses needed from the first laser beam to produce an amount of material necessary to form a mass-limited target plume based on the ablation rate;
   determining an angle of incidence between the first laser beam and the surface of the target material to shape the mass-limited target plume to increase collection efficiency and reduce debris generation when the mass-limited target plume is irradiated by a second laser beam;
   non-thermally ablating the surface of the target material utilizing the first laser beam according to the number of pulses determined to create the mass-limited target plume ejected from the surface of the target material without heat dissipation; and
   irradiating the mass-limited target plume utilizing the second laser beam to produce a high-temperature plasma for EUV radiation.

2. The method of claim 1, wherein the pulse duration of the first laser beam is configured to provide a non-thermal ablation of the target material that generates only gas phase species.

3. The method of claim 1, wherein the second laser beam is a high intensity pulsed infrared or CO2 laser beam.

4. The method of claim 1, further comprising: defining cavities on the surface of the target material to confine and shape the portion of the target material ejected.

5. The method of claim 1, further comprising: doping the target material with an absorber to enhance absorption of a particular range of laser wavelengths.

6. An apparatus for generating extreme ultraviolet (EUV) light, the apparatus comprising:
   an enclosure, the enclosure configured for enclosing a target material, the enclosure having at least a first window and a second window;
   a support substrate for securing and supporting the target material inside the enclosure;
   a first laser device, the first laser device configured for providing a first laser beam focused on a surface of the target material through the first window to non-thermally ablate the surface of the target material positioned inside the enclosure to create a mass-limited target plume ejected from the surface of the target material without heat dissipation, wherein the first laser beam is configured to ablate the surface of the target material from a predetermined incidence angle and according to a predetermined number of pulses to create the mass-limited target plume, wherein the predetermined incidence angle is an angle between the first laser beam and the surface of the target material determined to shape the mass-limited target plume to increase collection efficiency and reduce debris generation when the mass-limited target plume is irradiated by a second laser beam, wherein the predetermined number of pulses is calculated based on an ablation rate of the first laser beam to produce the mass-limited target plume, and wherein the first laser beam has a pulse duration less than an electron lattice-relaxation time of the target material, the first laser beam has a wavelength in a range of ultraviolet wavelengths, and the pulse duration, the wavelength, and an intensity of the first laser beam are tuned so that when the target material is ablated by the first laser beam, a penetration depth of the ablation is near that of an optical absorption depth of the target material to reduce thermal damage to the target material and to induce a rapid phase change of the mass-limited target plume ejected from the surface of the target material when the target material is ablated by the first laser beam; and a second laser device, the second laser device configured for providing the second laser beam through the second window to irradiate the mass-limited target plume inside the enclosure, wherein the irradiated mass-limited target plume produces a high-temperature plasma for EUV radiation.

7. The apparatus of claim 6, wherein the first laser beam is a short pulsed ultraviolet laser beam configured to provide a non-thermal ablation of the target material that generates only gas phase species.

8. The apparatus of claim 6, wherein the second laser beam is a high intensity pulsed infrared or CO2 laser beam.

9. The apparatus of claim 6, further comprising:
an aperture positioned in an optical path between the target material and the first laser device, the aperture configured for shaping the first laser beam to control a shape of the plume.

10. The apparatus of claim 6, wherein the enclosure is at least one of: a vacuum chamber or a high pressure chamber.

11. The apparatus of claim 6, further comprising:
a third laser device, the third laser device configured for providing a third laser beam through a third window of the enclosure to non-thermally ablate the target material positioned inside the enclosure.

12. The apparatus of claim 6, further comprising:
a fourth laser device, the fourth laser device configured for providing a fourth laser beam through a fourth window of the enclosure to jointly irradiate the plume inside the enclosure with the second laser beam.

13. An apparatus for generating extreme ultraviolet (EUV) light, the apparatus comprising:

an enclosure, the enclosure configured for enclosing a target material, the enclosure having at least a first window and a second window;
a support substrate for securing and supporting the target material inside the enclosure;
a first laser device, the first laser device configured for providing a first laser beam to ablate a surface of the target material from a predetermined incidence angle and according to a predetermined number of pulses to create a mass-limited target plume ejected from the surface of the target material, wherein the predetermined incidence angle is an angle between the first laser beam and the surface of the target material determined to shape the mass-limited target plume to increase collection efficiency and reduce debris generation when the mass-limited target plume is irradiated by a second laser beam, and wherein the predetermined number of pulses is calculated based on an ablation rate of the first laser beam to produce the mass-limited target plume, the first laser beam having a pulse duration multiple orders of magnitude faster than a time of heat dissipation of absorbed laser energy by thermal conduction of the target material, the first laser beam having a wavelength in a range of ultraviolet wavelengths, wherein the pulse duration, the wavelength, and an intensity of the first laser beam are tuned so that when the target material is ablated by the first laser beam, a penetration depth of the ablation is near that of an optical absorption depth of the target material, thereby separating and ejecting a portion of the target material away from the surface in a non-thermal manner to create the mass-limited target plume without heat dissipation; and
a second laser device, the second laser device configured for providing a second laser beam through the second window to irradiate the mass-limited target plume inside the enclosure, wherein the irradiated mass-limited target plume produces a high-temperature plasma for EUV radiation.

14. The apparatus of claim 13, wherein the pulse duration of the first laser beam is configured to provide a non-thermal ablation of the target material that generates only gas phase species.

15. The apparatus of claim 13, wherein the second laser beam is a high intensity pulsed infrared or CO2 laser beam.

16. The apparatus of claim 13, further comprising:
an aperture positioned in an optical path between the target material and the first laser device, the aperture configured for shaping the first laser beam to control a shape of the plume.

17. The apparatus of claim 13, wherein the target material is doped with an absorber to enhance absorption of a particular range of laser wavelengths.

18. The apparatus of claim 13, wherein the target material is doped with an absorber containing anthracene to enhance absorption of laser wavelengths between 351 and 355 nm.

* * * * *